US011398364B2

(12) United States Patent
Kitamura et al.

(10) Patent No.: US 11,398,364 B2
(45) Date of Patent: Jul. 26, 2022

(54) ELECTRON GUN, ELECTRON MICROSCOPE, THREE-DIMENSIONAL ADDITIVE MANUFACTURING APPARATUS, AND METHOD OF ADJUSTING CURRENT OF ELECTRON GUN

(71) Applicant: JEOL Ltd., Tokyo (JP)

(72) Inventors: Shinichi Kitamura, Tokyo (JP); Takuma Iwasaki, Tokyo (JP); Takashi Sato, Tokyo (JP); Atsushi Kimura, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/064,023

(22) Filed: Oct. 6, 2020

(65) Prior Publication Data

US 2021/0151278 A1    May 20, 2021

(30) Foreign Application Priority Data

Oct. 7, 2019   (JP) .............................. JP2019-184262

(51) Int. Cl.
| | | |
|---|---|---|
| *H01J 37/075* | (2006.01) | |
| *H01J 37/073* | (2006.01) | |
| *H01J 37/26* | (2006.01) | |

(52) U.S. Cl.
CPC .......... *H01J 37/075* (2013.01); *H01J 37/073* (2013.01); *H01J 37/26* (2013.01); *H01J 2237/062* (2013.01); *H01J 2237/282* (2013.01)

(58) Field of Classification Search
CPC ........ H01J 37/073; H01J 37/075; H01J 37/26; H01J 2237/062; H01J 2237/282
See application file for complete search history.

(56) References Cited

U.S. PATENT DOCUMENTS

| | | | |
|---|---|---|---|
| 3,379,910 A | | 4/1968 | Chorney et al. |
| 4,104,526 A | * | 8/1978 | Albert ................ H01J 35/30 378/124 |

(Continued)

FOREIGN PATENT DOCUMENTS

| | | | | |
|---|---|---|---|---|
| EP | 2096661 A1 | * | 9/2009 | ............ H01J 37/073 |
| GB | 2164202 A | * | 3/1986 | ............. H01J 37/04 |

(Continued)

OTHER PUBLICATIONS

Extended European Search Report issued in EP20199943.0 dated Apr. 16, 2021.
Office Action issued in JP2019184262 dated Oct. 26, 2021.

*Primary Examiner* — David E Smith
(74) *Attorney, Agent, or Firm* — The Webb Law Firm

(57) ABSTRACT

An electron gun includes a cathode that is heated to emit thermions; a cathode heating power supply that supplies a cathode heating current for heating the cathode; a grid that has a first aperture formed therein and that has a grid voltage applied thereto, the grid voltage having a potential lower than that of the cathode, wherein the grid converges the thermions passing through the first aperture by the grid voltage; an anode that has a second aperture formed therein and that has an anode voltage applied thereto, wherein the anode causes the thermions extracted from the cathode to pass through the second aperture as an electron beam by the anode voltage; an anode-voltage power supply that applies the anode voltage to the anode; and a controller that causes the anode voltage having a positive potential to be applied from the anode-voltage power supply to the anode.

16 Claims, 10 Drawing Sheets

(56) References Cited

U.S. PATENT DOCUMENTS

| | | | |
|---|---|---|---|
| 4,695,773 A * | 9/1987 | Veneklasen | H01J 3/021 |
| | | | 315/382 |
| 2006/0102840 A1* | 5/2006 | Nakada | H01J 37/265 |
| | | | 250/310 |
| 2012/0196051 A1 | 8/2012 | Kuzmichev et al. | |
| 2017/0136541 A1* | 5/2017 | Fager | B22F 12/00 |
| 2017/0309437 A1 | 10/2017 | Agemura et al. | |
| 2018/0019094 A1* | 1/2018 | Iwata | H01J 37/073 |

FOREIGN PATENT DOCUMENTS

| | | | | |
|---|---|---|---|---|
| JP | H08236052 A | 9/1996 | | |
| JP | H10321120 A | 12/1998 | | |
| JP | WO2011034086 A1 | 3/2011 | | |
| JP | 2015174423 A * | 10/2015 | | |
| WO | WO-2015053300 A1 * | 4/2015 | | H01J 37/073 |
| WO | 2016063325 A1 | 4/2016 | | |
| WO | WO-2016103493 A1 * | 6/2016 | | B22F 3/1055 |

* cited by examiner

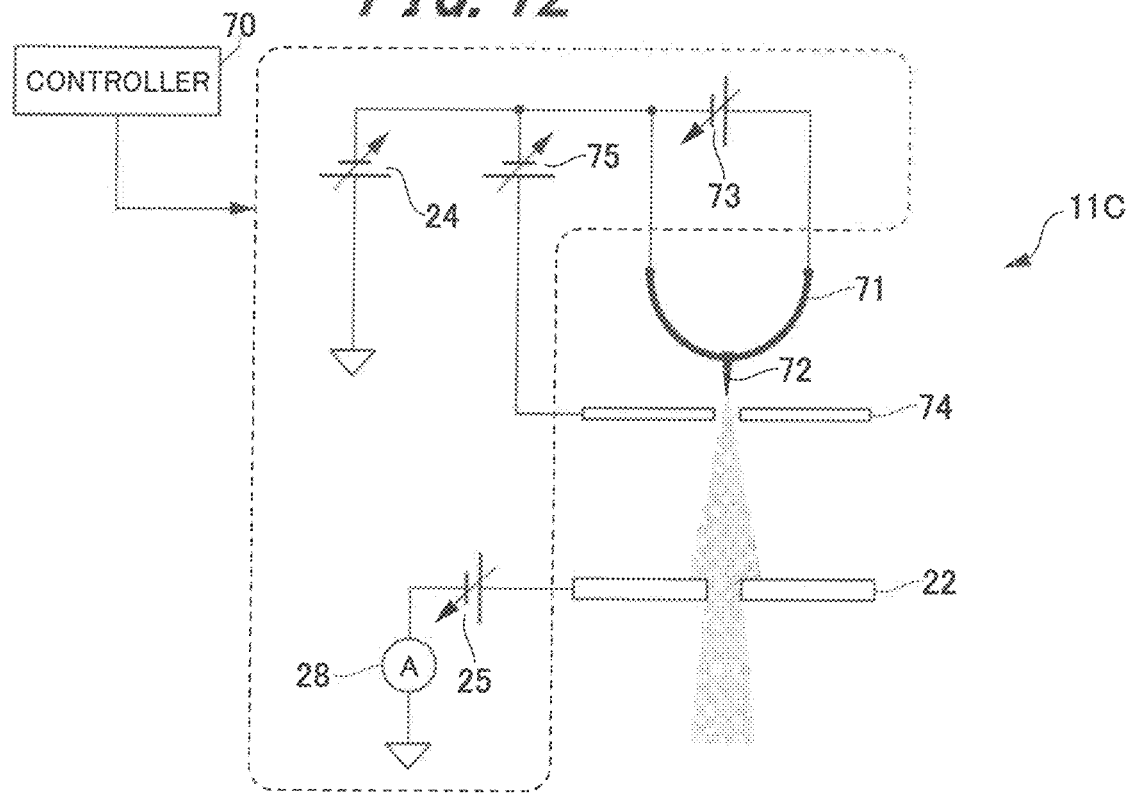
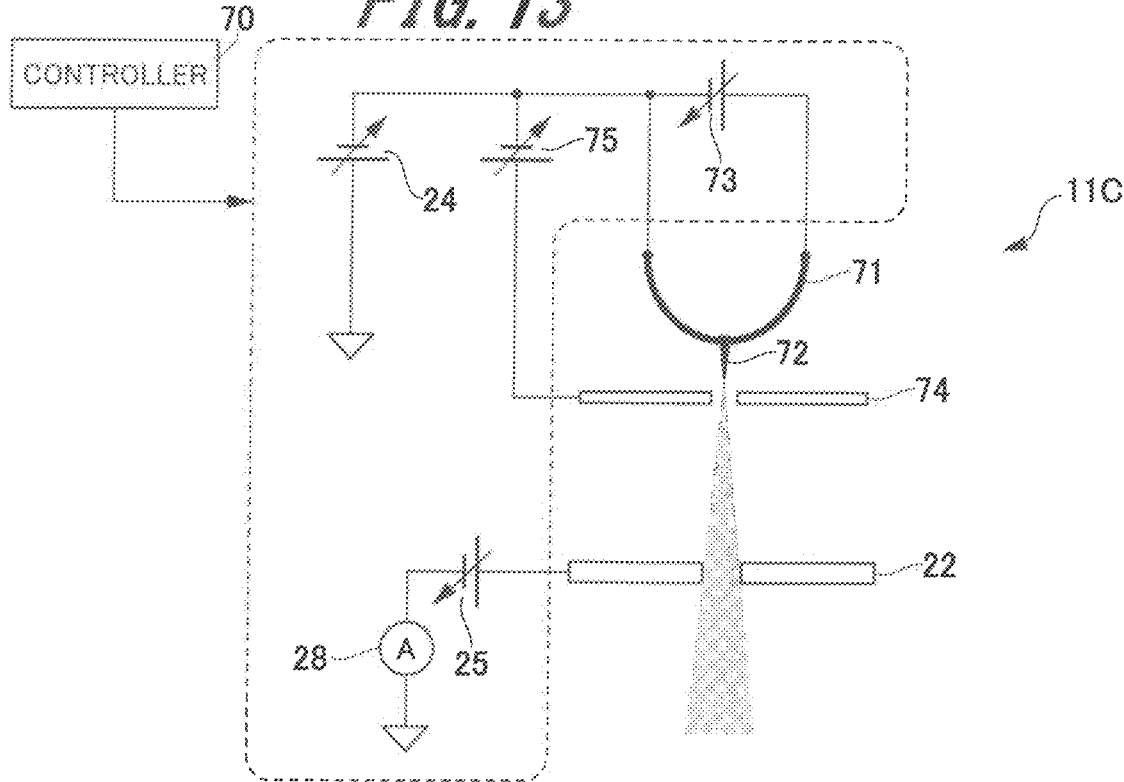

ELECTRON GUN, ELECTRON MICROSCOPE, THREE-DIMENSIONAL ADDITIVE MANUFACTURING APPARATUS, AND METHOD OF ADJUSTING CURRENT OF ELECTRON GUN

CROSS REFERENCES TO RELATED APPLICATION

This applications claims priority Japanese Patent Application No. 2019-184262 filed Oct. 7, 2019, the disclosure of which is hereby incorporated by reference in its entirety.

BACKGROUND OF THE INVENTION

Field of the Invention

The present invention relates to an electron gun, an electron microscope, a three-dimensional additive manufacturing apparatus (hereinafter referred to as "three-dimensional AM apparatus"), and a method of adjusting the current of an electron gun.

Description of the Related Art

An electron microscope apparatus and a three-dimensional AM apparatus, both using an electron source such as thermions as a source, are each provided with an electron beam column. In the electron microscope, a specimen is irradiated with an electron beam to generate secondary electrons or transmission electrons from the surface thereof, and an image is obtained from the secondary electrons or transmission electrons generated from the surface of the specimen. In the three-dimensional AM apparatus, metal powder (i.e., a powder specimen) spread on a powder bed is irradiated with an electron beam having a current of the order of milliamperes to form a melt layer of the metal powder, and an object is obtained by layering a plurality of melt layers of the metal powder.

In the three-dimensional AM apparatus which uses the electron beam, a controller provided in the apparatus controls a grid voltage of the electron gun to set the beam current of the electron beam to an arbitrary value. On the other hand, in the electron microscope, an aperture is provided on the axis of the electron beam, and the current of the electron beam is controlled by adjusting the aperture angle of the electron beam by controlling the excitation of the condenser lens.

Conventionally, in various apparatuses using the electron beam, measures have been taken to cope with ion collision with the cathode (called "ion bombard") caused by positive ions generated by emission of the electron beam.

For example, WO2011/034086 (hereinafter referred to as "Patent document 1") discloses an electron gun having a repeller electrode provided between an anode electrode and an emission hole from which the electron beam is emitted. Such electron gun has a function which is: by repelling the positive ions rising along the central axis of the electron beam to the vacuum chamber side by the repeller electrode, damage to the cathode electrode can be prevented.

SUMMARY OF THE INVENTION

However, since an electron microscope does not have an ion reflector which prevents positive ions from rising, there is a possibility that ion bombardment of the cathode may be caused by rising positive ions generated from the specimen irradiated with an electron beam. On the other hand, in a three-dimensional AM apparatus, an ion reflector provided under an anode having a ground potential (0V) repels the rising positive ions; however, secondary electrons generated when scattered electrons hit the anode and/or when the electron beam spread from the cathode hits the anode are emitted above the anode. These secondary electrons ionize the residual gas present between the cathode and the anode, so that there is a possibility that ion bombardment of the cathode may occur re ionization of the residual gas is promoted.

If the technique disclosed in Patent document 1 is used, a repeater electrode will have to be added to the electron gun, so that an adjustment work for incorporating the repeller electrode will be required, which makes the configuration of the electron gun complicated.

The present invention has been made in view of the above problems, and it is an object of the present invention to prevent ion bombardment of the cathode.

An electron gun according to an aspect of the present invention includes a cathode that is heated to emit thermions; a cathode heating power supply that supplies a cathode heating current for heating the cathode; a grid that has a first aperture formed therein along a central axis of a tip of the cathode and that has a grid voltage applied thereto, the grid voltage having a potential lower than that of the cathode, wherein the grid converges the thermions passing through the first aperture by the grid voltage applied thereto; an anode that has a second aperture formed therein along the central axis and that has an anode voltage applied thereto, wherein the anode causes the thermions extracted from the cathode to pass through the second aperture as an electron beam by the anode voltage applied thereto; an anode-voltage power supply that applies the anode voltage to the anode; and a controller that causes the anode voltage having a positive potential to be applied from the anode-voltage power supply to the anode.

An electron gun according to another aspect of the present invention includes a cathode that is heated to emit thermions; a cathode heating power supply that supplies a cathode heating current for heating the cathode; a grid that has a first aperture formed therein along a central axis of a tip of the cathode and that has a grid voltage applied thereto, the grid voltage having a potential lower than that of the cathode, wherein the grid converges the thermions passing through the first aperture by the grid voltage applied thereto; an anode that has a second aperture formed therein along the central axis, wherein the anode causes the thermions extracted from the cathode to pass through the second aperture as an electron beam by a ground potential; an anode-current detector that detects an anode current flowing through the anode; and a controller that increases, if the detected anode current exceeds a preset current threshold, the cathode heating current supplied from the cathode heating power supply to the cathode so as to return the anode current to its original value.

An electron gun according to further another aspect of the present invention includes an emitter; an extracting electrode that has a first aperture formed therein along a central axis of a tip of the emitter and that has an extracting voltage applied thereto, the extracting voltage having a potential higher than that of the emitter, wherein the extracting electrode extracts electrons from the emitter and passes the extracted electrons through the first aperture by the extracting voltage applied thereto; an anode that has a second aperture formed therein along the central axis and that has an anode voltage having a positive potential applied thereto, wherein the anode causes the electrons extracted from the emitter to pass through the second aperture as an electron beam by the anode voltage applied thereto; an anode-voltage power supply that applies the anode voltage to the anode; and a controller that changes the anode voltage applied to the anode to change the extracting voltage.

According to the present invention, since the anode voltage having a positive potential is applied to the anode from the anode-voltage power supply, for example, the secondary electrons are taken into the anode, and the ionized residual gas is repelled due to the anode potential, so that ion bombardment of the cathode can be prevented.

Problems, configurations and effects other than those described above will be elucidated by the following description of the embodiments.

BRIEF DESCRIPTION OF THE DRAWINGS

FIG. 12 is an enlarged view showing a field-emission electron gun according to a fourth embodiment of the present invention; and FIG. 13 is an enlarged view of the field-emission electron gun according to the fourth embodiment of the present invention.

DESCRIPTION OF THE INVENTION

Figure 1:
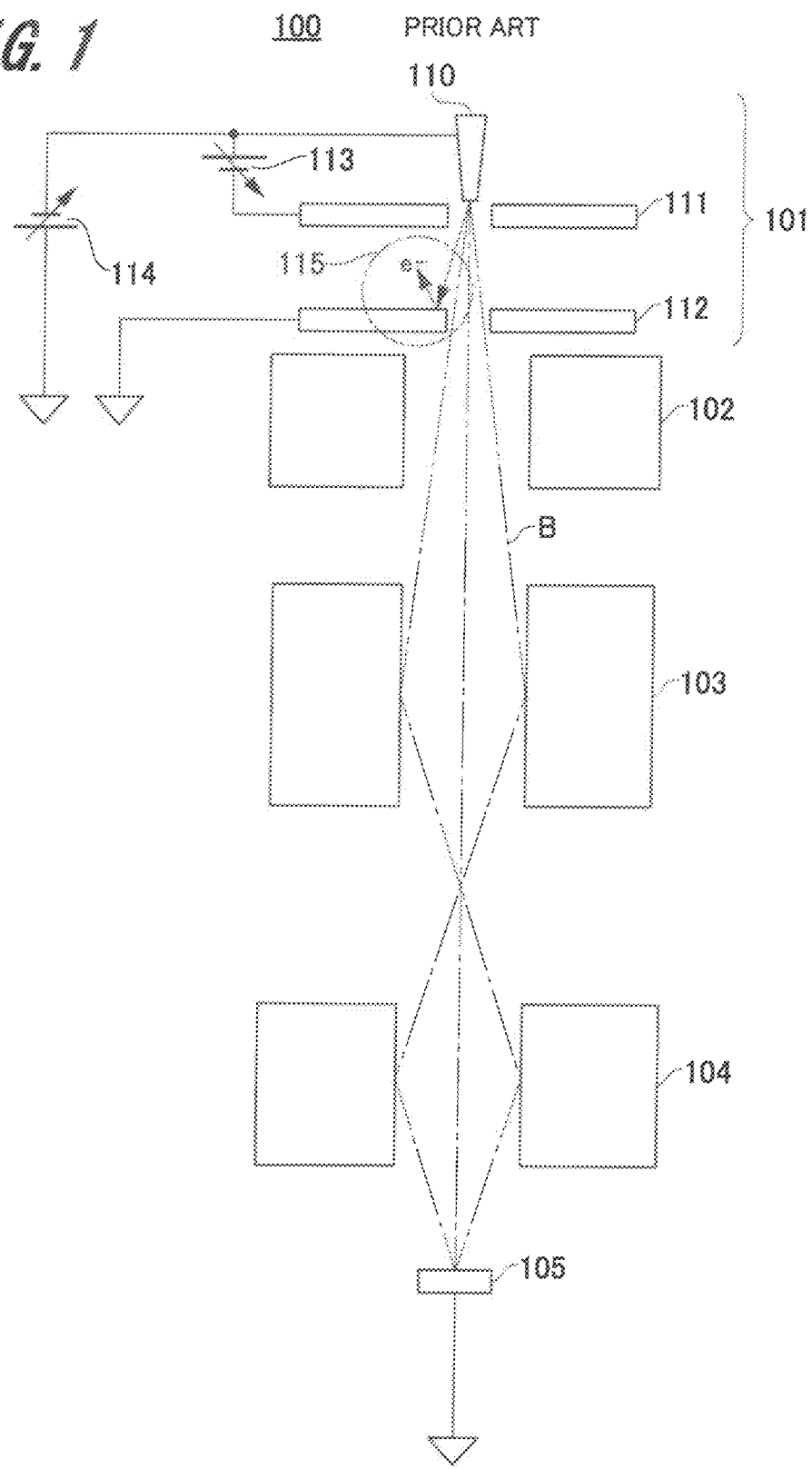
FIG. 1 is a schematic view showing a configuration example of an electron beam column of a conventional electron microscope.

Embodiments of the present invention will be described below with reference to the attached drawings. Note that, in the description and the drawings, components having substantially the same function or configuration are designated by the same reference numerals, and explanation thereof will not be repeated.

[An Electron Microscope and a Three-Dimensional AM Apparatus Both Having a Conventional Electron Gun]

First, configuration examples of an electron microscope and a three-dimensional AM apparatus both having a conventional electron gun will be described below with reference to FIGS. 1 and 2.

First, a configuration example of a conventional electron microscope will be described below.

FIG. 1 is a schematic view showing a configuration example of an electron beam column of a conventional electron microscope 100.

The electron microscope 100 includes an electron gun 101, a gun alignment 102, a condenser lens 103 and an objective lens 104. The electron gun 101 includes a cathode 110, a grid 111, an anode 112, a grid-voltage power supply 113 and an accelerating-voltage power supply 114.

The cathode 110 used as an electron source of an electron beam B is formed of, for example, tungsten, $LaB_6$ crystal or the like. A negative potential is applied to the cathode 110 by the accelerating-voltage power supply 114. The cathode 110 is heated to about 1500° C. to 2000° C. by applying a cathode heating current to the cathode 110 itself by a cathode heating power supply (not shown), or by applying a cathode heating current to a pyrolytic graphite heater (hereinafter referred to as "PG heater") or the like. When the cathode 110 is heated, the cathode 110 emits thermions.

The grid 111 is arranged in the vicinity of the cathode 110. A potential more negative than that of the cathode 110 is applied to the grid 111 by the grid-voltage power supply 113. Due to the grid potential of the grid 111, the amount of thermions emitted from the cathode 110 is suppressed.

The anode 112 is arranged below the grid 111. The anode potential of the anode 112 is the ground potential that corresponds to a positive side having a potential higher than the potential of the cathode 110. Therefore, the thermions generated from the cathode 110 are extracted toward the anode direction (the lower side of the drawing) by the anode potential. As described above, since the amount of the thermion emission is suppressed due to the grid potential of the grid 111, the amount of the thermion emission can be suppressed to reduce the apparent electron generation region (i.e., the electron source) by increasing the potential of the grid 111 to the negative side.

Normally, the anode 112 has the ground potential, and the potential applied to the cathode 110 is minus several tens of kV. Thus, the thermions accelerated by a potential difference of several tens of kV, as the electron beam B, pass through the anode 112, and then pass through the gun alignment 102, the focusing lens 103, and the objective lens 104 to irradiate the specimen placed on a stage 105.

The gun alignment 102 is adapted to correct mechanical misalignment in the apparatus so that the electron beam B passes through the lens centers of the condenser lens 103 and the objective lens 104.

The condenser lens 103 is adapted to cross over the electron beam B to regulate the irradiation range of the electron beam B. In the electron microscope 100, the shape and aperture angle of the electron beam B are adjusted by an aperture (not shown).

The objective lens 104 is adapted to focus the electron beam B on the specimen.

A part of the thermions emitted from the cathode 110 may hit the anode 112. For example, as shown in a region 115, when the thermions hit the anode 112, secondary electrons are generated from the anode 112. Since most of the secondary electrons have an energy of about 100 eV or less, residual gas around the secondary electrons is easily ionized to generate ions, and the ions collide with the cathode 110 to cause ion bombardment. As a result, the cathode 110 is damaged by the colliding ions.

Next, a configuration example of a conventional three-dimensional AM apparatus will be described below.

Figure 2:
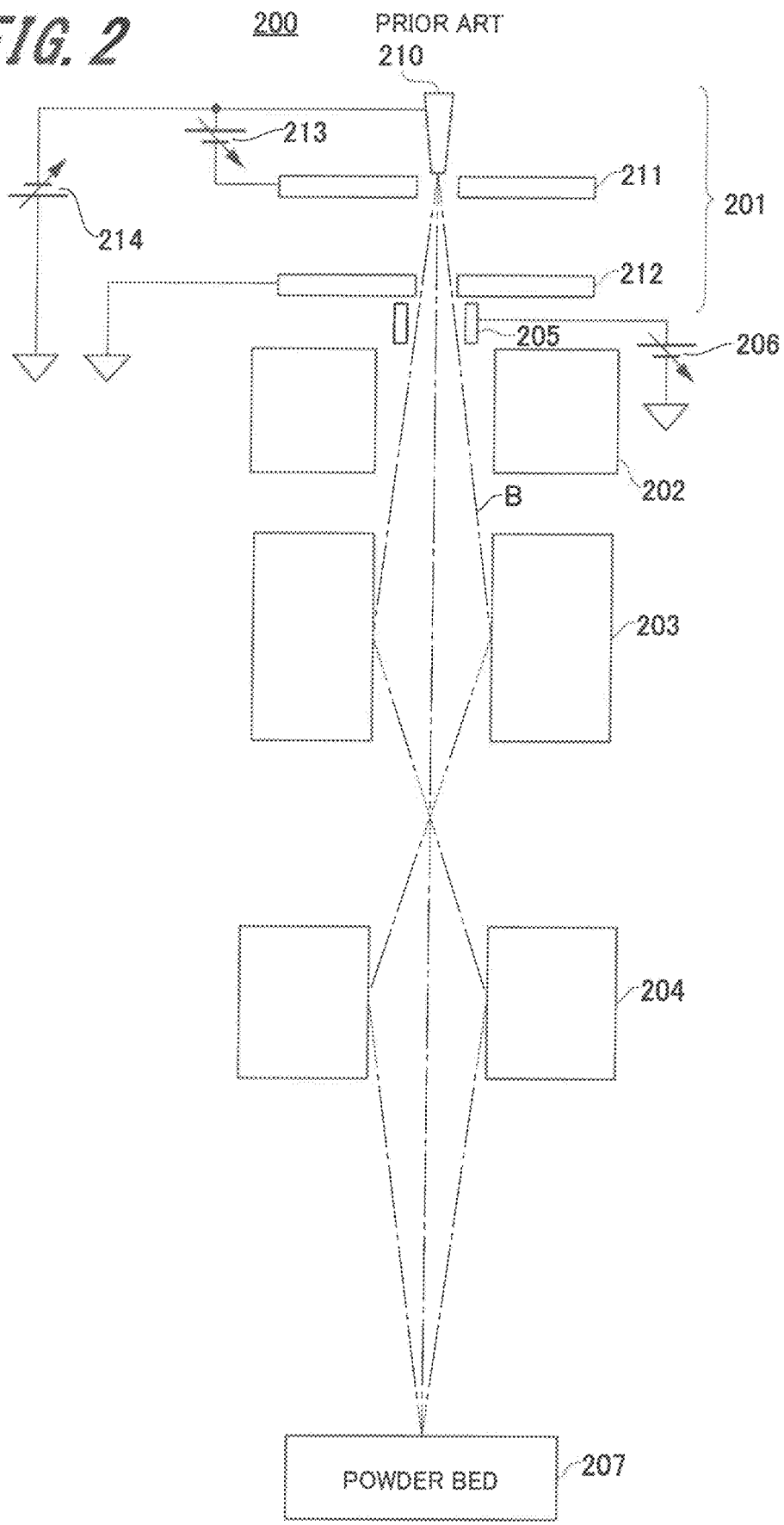
FIG. 2 is a schematic view showing a configuration example of an electron beam column of a conventional three-dimensional AM apparatus.

FIG. 2 is a schematic view showing a configuration example of an electron beam column of a conventional three-dimensional AM apparatus 200.

The three-dimensional AM apparatus 200 includes an electron gun 201, a gun alignment 202, a condenser lens 203, an objective lens 204, an ion reflector 205 and a reflector power supply 206. The electron gun 201 includes a cathode 210, a grid 211, an anode 212, a grid-voltage power supply 213 and an accelerating-voltage power supply 214.

Since the electron gun 201, the gun alignment 202, the condenser lens 203 and the objective lens 204 have the same function and configuration as those of the electron gun 101, the gun alignment 102, the condenser lens 103 and the objective lens 104 shown in FIG. 1, detailed description of the function and configuration of these components will be omitted. Further, since the cathode 210, the grid 211, the anode 212, the grid-voltage power supply 213 and the accelerating-voltage power supply 214 have the same function and configuration as those of the cathode 110, the grid 111, the anode 112, the grid-voltage power supply 113 and the accelerating-voltage power supply 114 shown in FIG. 1, detailed description of the function and configuration of these components will be omitted.

The electron beam B emitted from the electron gun 201 passes through the gun alignment 202, the condenser lens 203 and the objective lens 204 to irradiate the powder spread on a powder bed 207. The powder located in the portion irradiated with the electron beam B is melted layer by layer, and the melted layers are laminated on the powder bed 207 to form a three-dimensional object.

Since the beam current of the electron beam B possible to be irradiated by the three-dimensional AM apparatus 200 is orders of magnitude larger than the beam current of the electron microscope 100, the residual gas in the gun chamber and the electron beam column will be ionized by the electron beam B (a primary beam) composed of primary electrons extracted from the cathode 210, or by secondary electrons including backscattered electrons from the powder bed 207 irradiated with the electron beam B, or by scattered electrons in the gun chamber (not shown).

At this time, since the ionized the residual gas are almost positive ions, these positive ions rise to just below the anode 212 while being attracted by the primary beam in the electron beam column. A positive voltage (about 50V to 1 kV) is applied to the ion reflector 205 by the reflector power supply 206. Since the positive ions of the ionized residual gas are repelled due to the potential barrier of the ion reflector 205 to which the positive voltage is applied, the positive ions do not reach above the ion reflector 205.

Therefore, the ion reflector 205 is indispensable for the electron beam column in the three-dimensional AM apparatus 200. If the electron beam column is not provided with the ion reflector 205, the positive ions having passed through the anode 212 will be accelerated upward by the negative potential of the cathode 210. Consequently, the accelerated positive ions bombard the surface of the cathode 210 to thereby damage the cathode 210.

Incidentally, it is considerable that the electron microscope 100 is also provided with the ion reflector on so that the ions generated below the ion reflector can be repelled. However, if the electron microscope 100 is provided with the ion reflector, the manufacturing cost may increase due to increased number of parts. To solve such problems, configuration examples of an electron microscope and a three-dimensional AM apparatus 2 configured with no ion reflector according to the embodiment of the present invention will be described below.

First Embodiment

<An Electron Microscope and a Three-Dimensional AM Apparatus Each Having an Electron Gun According to a First Embodiment of the Present Invention>

Next, configuration examples of an electron microscope (a scanning electron microscope) and a three-dimensional AM apparatus, each having an electron gun according to a first embodiment of the present invention, will be described below with reference to FIGS. 3-6.

<A Configuration Example of an Electron Microscope>

Figure 3:
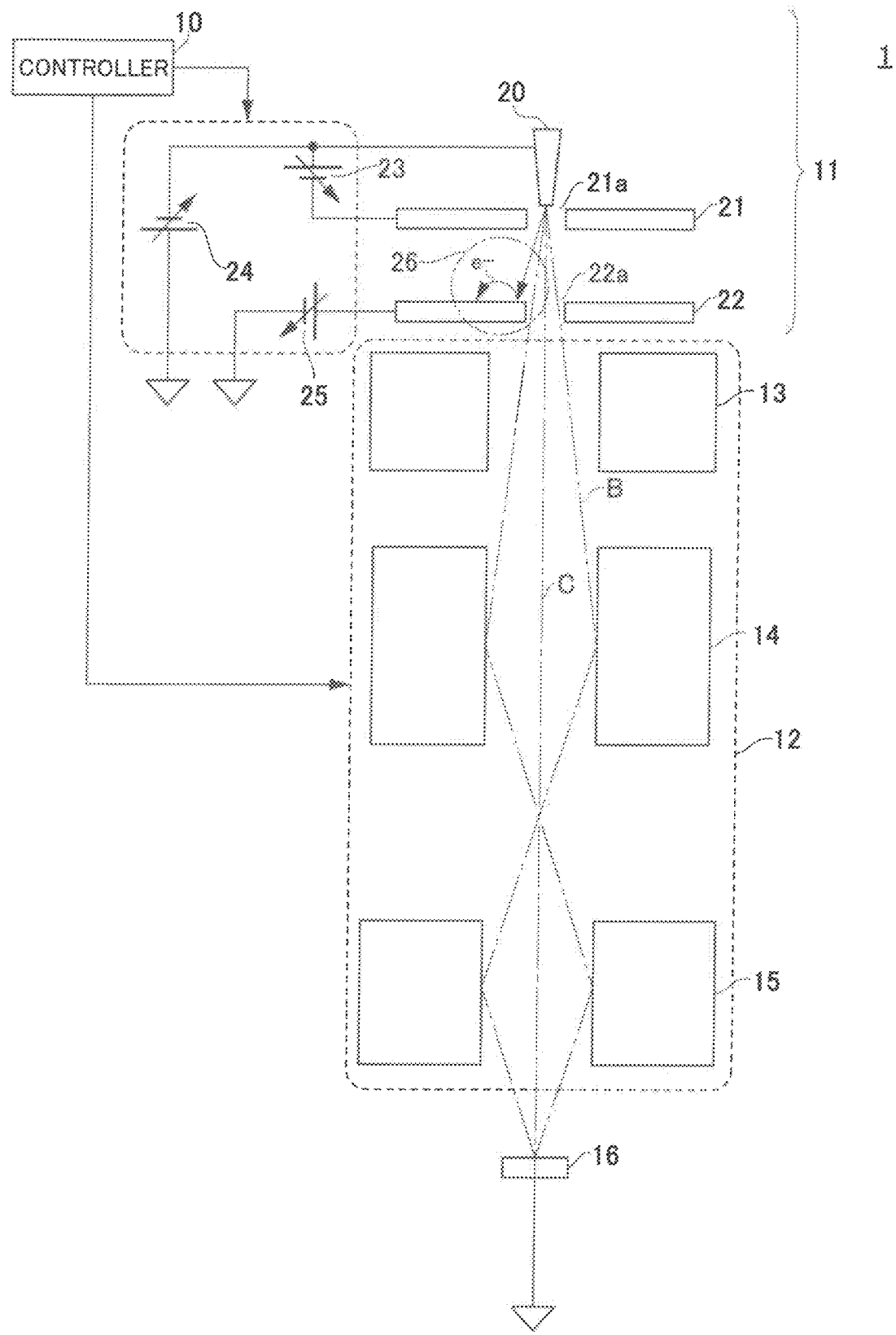
FIG. 3 is a schematic view showing a configuration example of an electron beam column of an electron microscope according to a first embodiment of the present invention.

FIG. 3 is a schematic view showing a configuration example of an electron beam column of an electron microscope 1.

The electron microscope 1 includes an electron gun 11, an electron optical system 12 and a stage 16. The electron gun 11 includes a controller 10, a cathode 20, a grid 21, an anode 22, a grid-voltage power supply 23, an accelerating-voltage power supply 24 and an anode-voltage power supply 25. The electron optical system 12 includes a gun alignment 13, a condenser lens 14 and an objective lens 15. The electron microscope 1 further includes, although not shown in the drawings, a deflection coil, a stigma coil and the like, wherein the deflection coil is adapted to scan an electron beam B, and the stigma coil is adapted to correct astigmatism.

The cathode 20 is heated by a cathode heating current to emit thermions, wherein the cathode heating current is supplied by a cathode heating power supply 27 (see FIG. 4, which is to be explained later) for heating the cathode 20.

The grid 21 has a first aperture 21a formed therein along the central axis C of the tip of the cathode 20. The grid 21 converges the thermions passing through the first aperture 21a by a grid voltage applied thereto, the grid voltage having a potential lower than that of the cathode 20.

The anode 22 has a second aperture 22a formed therein along the central axis C. An anode voltage is applied from the anode-voltage power supply 25 to the anode 22. Due to its anode voltage, the anode 22 extracts thermions from the cathode 20 and causes the extracted thermions to pass through the second aperture 22a as the electron beam B.

The controller 10 causes the anode-voltage power supply 25 to apply an anode voltage having a positive potential to the anode 22. Further, the controller 10 controls the operations of the power supplies 23 to 25 and the electron optical system 12 of the electron microscope 1. The electron optical system 12 scans the specimen placed on the stage 16 with the electron beam B.

The configuration of the electron beam column of the electron microscope 1 is basically identical to that of the conventional electron microscope 100 shown in FIG. 1. In other words, the electron gun 11, the gun alignment 13, the condenser lens 14 and the objective lens 15 have the same function and configuration as those of the electron gun 101, the gun alignment 102, the condenser lens 103 and the objective lens 104 shown in FIG. 1.

The grid-voltage power supply 23 applies a grid voltage having a potential lower than that of the cathode 20 to the grid 21.

The accelerating-voltage power supply 24 applies a negative voltage both to the cathode 20 and the grid 21.

The anode-voltage power supply 25 applies a positive voltage to the anode 22.

In the electron gun 11 according to the present embodiment, the cathode 20 is formed of, for example, a lanthanum hexaboride (LaB$_6$), and the anode 22 is made of a material which less emits secondary electrons generated by electron excitation, such as titanium (Ti).

The anode 22 is provided with the anode-voltage power supply 25 for applying a positive voltage. Therefore, even if the secondary electrons are emitted at the anode 22, the secondary electrons will be immediately taken into the anode 22 as shown in the region 26. Since generation of secondary electrons emitted from the anode 22 is suppressed in this manner, ionization of the residual gas caused by the secondary electrons is suppressed, and therefore the ions reaching the cathode 20 and grid 21 can be reduced. In other words, the anode 22, to which a positive voltage is applied, has a function of preventing ion bombardment, just like the function of an ion reflector.

Figure 4:
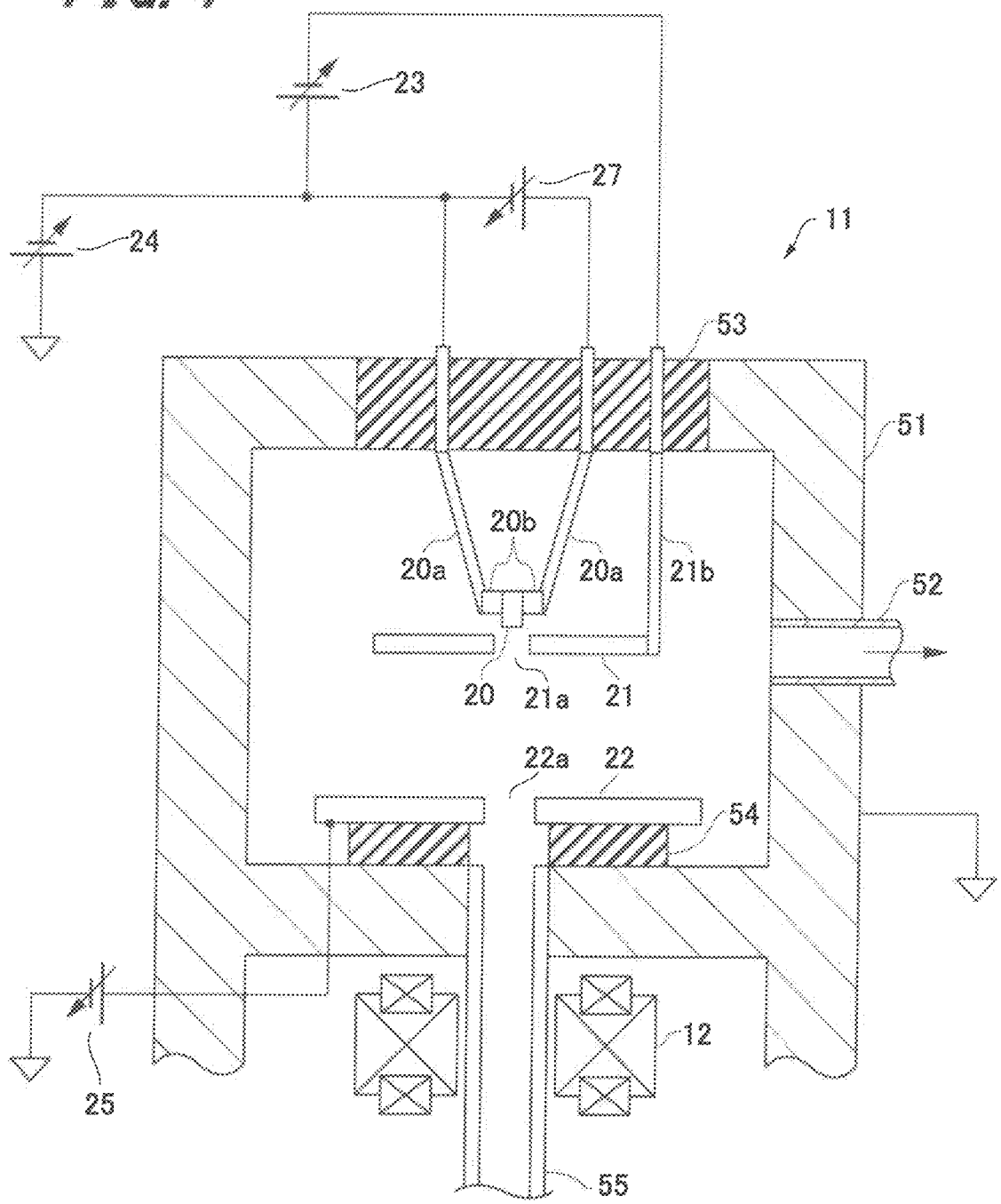
FIG. 4 is an enlarged schematic view showing a configuration example of an electron gun according to the first embodiment of the present invention.

FIG. 4 is an enlarged schematic view showing a configuration example of the electron gun 11

In addition to the controller 10 (which is not shown in FIG. 4), the cathode 20, the grid 21, and the anode 22 shown in FIG. 3, the electron gun 11 further includes a gun chamber 51, an evacuation pipe 52, insulators 53, 54, and a liner tube 55.

The gun chamber 51 is formed to house the cathode 20, the grid 21 and the anode 22 therein.

The evacuation pipe 52 is attached to one side surface of the gun chamber 51 and is connected to a vacuum pump (not shown). When the vacuum pump is operated, the air in the gun chamber 51 is discharged through the vacuum drawing pipe 52, so that the inside of the gun chamber 51 is almost in a vacuum state. However, a small amount of gas remains in the gun chamber 51.

The insulators 53, 54 are each made of a non-conductive material, and therefore have insulating properties.

Two current introduction terminals 20a, which are connected to the cathode 20, and one current introduction terminal 21b, which is connected to the grid 21, are passed through the insulator 53, so that the cathode 20 and the grid 21 do not come into contact with the gun chamber 51. Of the two current introduction terminals 20a connected to the cathode 20, one is connected to a positive electrode of the cathode heating power supply 27 through a lead wire provided outside the gun chamber 51, and the other is connected to a negative electrode of the cathode heating power supply 27 through a lead wire provided outside the gun chamber 51. A PG heater 20b is energized by the two current introduction terminals 20a so as to heat the cathode 20. The current introduction terminal 21b connected to the grid 21 is connected to a negative electrode of the grid-voltage power supply 23 through a lead wire provided outside the gun chamber 51.

The insulator 54 holds the anode 22 so that the anode 22 does not come into contact with the gun chamber 51. The anode 22 is connected to a positive electrode of the anode-voltage power supply 25 through a lead wire entering the gun chamber 51.

The liner tube 55 is a tube provided in the passage of the electron beam B emitted from the cathode 20. Incidentally, the liner tube 55 is not shown in FIG. 3. The liner tube 55 functions as a vacuum partition for keeping the gun alignment 13, the condenser lens 14, the objective lens 15 and the like outside the vacuum. The liner tube 55 is maintained at a reference potential (the ground potential), for example. Since the liner tube 55 and the anode 22 are not in contact with each other, it becomes possible for the anode voltage power supply 25 to keep the anode 22 at a positive potential. The electron beam B emitted from the cathode 20 passes through the liner tube 55 to irradiate the specimen placed on the stage 16.

In the electron beam column having the aforesaid configuration, positive ions are generated. Since the energy of positive ions is about 100 eV at the maximum, when a positive voltage of about 60 V to 1 kV is applied to the anode 22, most of the positive ions cannot cross the potential barrier of the anode 22 and will be repelled downward from the anode 22. Therefore, the positive ions do not reach an accelerating electric field between the anode 22 and the cathode 20 above the anode 22.

Further, even if a part of the electron beam B emitted from the cathode 20 spreads to hit the anode 22, the number of the secondary electrons generated from the anode 22 will be reduced. Further, since low-energy secondary electrons generated from the anode 22 are taken into the anode 22, to which the positive voltage is applied, and less likely to be emitted above the anode 22, the amount of the ions generated between the cathode 20 and the anode 22 is reduced, so that ion bombardment of the cathode 20 can be suppressed.

The electron gun 11 used as a thermion type electron source has been described above with reference to FIG. 4; however, the same effect of the electron gun 11 may also be achieved by an electron gun used as a field-emission-type electron source.

<A Configuration Example of a Three-Dimensional AM Apparatus>

Here, a configuration example of a three-dimensional AM apparatus according to the first embodiment will be described below.

Figure 5:
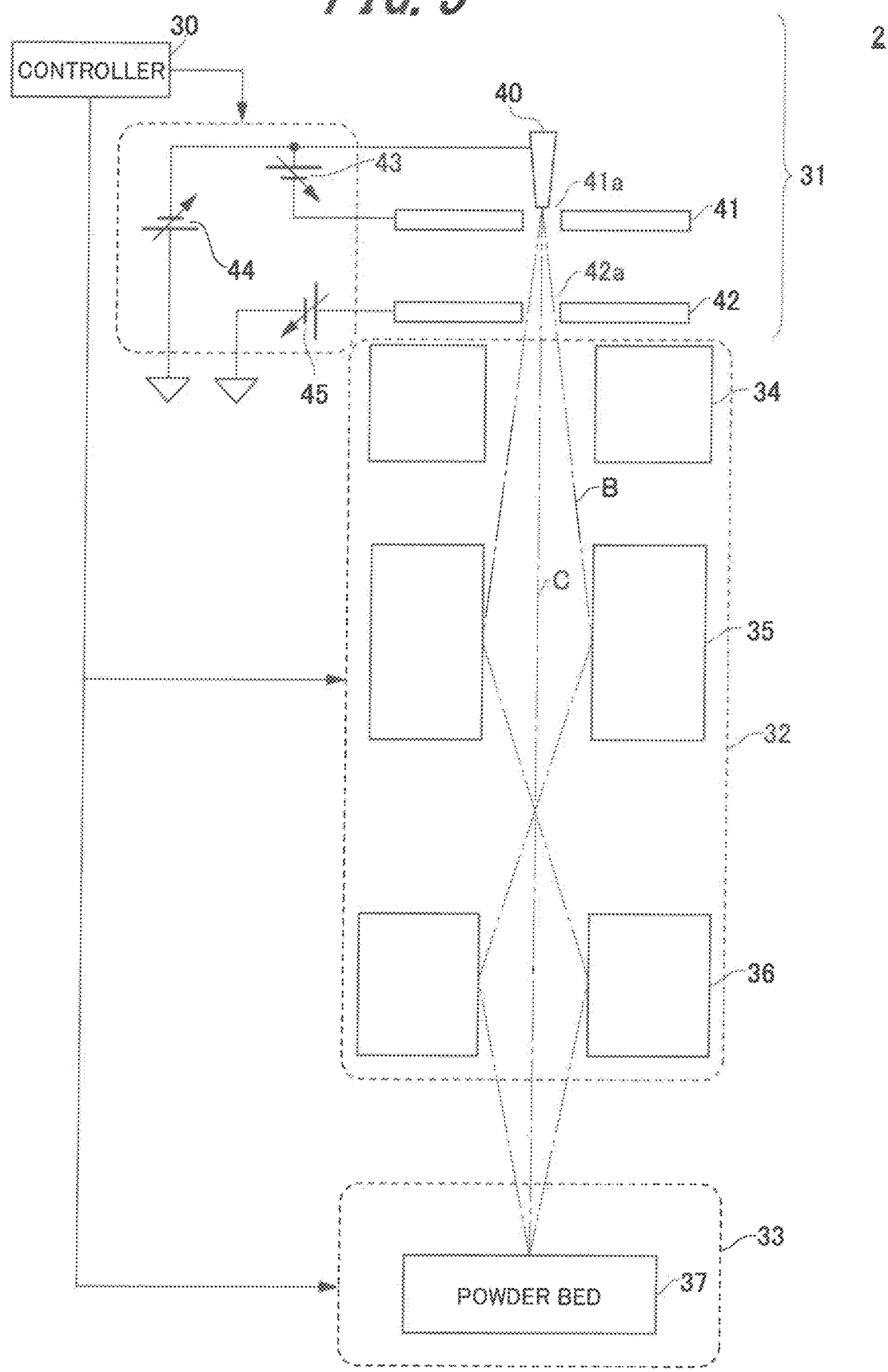
FIG. 5 is a schematic view showing a configuration example of an electron beam column of a three-dimensional AM apparatus according to the first embodiment of the present invention.

FIG. 5 is a schematic view showing a configuration example of an electron beam column of a three-dimensional AM apparatus 2.

The three-dimensional AM apparatus 2 includes an electron gun 31, an electron optical system 32 and a powder supply system 33.

The powder supply system 33 is adapted to spread a powder on a powder bed 37.

The electron gun 31 generates an electron beam B, and the electron optical system 32 scans the powder spread on the powder bed 37 with the electron beam B.

The electron gun 31 includes a controller 30, a cathode 40, a grid 41, an anode 42, a grid-voltage power supply 43, an accelerating-voltage power supply 44 and an anode-voltage power supply 45. The electron optical system 32 includes a gun alignment 34, a condenser lens 35 and an objective lens 36. The powder supply system 33 includes the powder bed 37.

The cathode 40 is heated by a cathode heating current so as to emit thermions, wherein the cathode heating current is supplied by a cathode heating power supply (see FIG. 4) for heating the cathode 40.

The grid 41 has a first aperture 41a formed therein along the central axis C of the tip of the cathode 40. The grid 41 converges the thermions passing through the first aperture 41a by a grid voltage applied thereto, the grid voltage having a potential lower than that of the cathode 40.

The anode 42 has a second aperture 42a formed therein along the central axis C. An anode voltage is applied from the anode-voltage power supply 45 to the anode 42. Due to its anode voltage, the anode 42 causes the thermions extracted from the cathode 40 to pass through the second aperture 42a as the electron beam B.

The controller 30 causes the anode-voltage power supply 45 to apply an anode voltage having a positive potential to the anode 42.

The controller 30 controls the operations of the power supplies 43 to 45, the electron optical system 12 and the powder supply system 33 of the three-dimensional AM apparatus 2.

The configuration of the electron beam column of the three-dimensional AM apparatus 2 is basically identical to that of the conventional three-dimensional AM apparatus 200 shown in FIG. 2. In other words, the electron gun 31, the gun alignment 34, the condenser lens 35 and the objective lens 36 have the same function and configuration as those of the electron gun 201, the gun alignment 202, the condenser lens 203 and the objective lens 204 shown in FIG. 2.

The grid-voltage power supply 43 applies a grid voltage having a potential lower than that of the cathode 40 to the grid 41.

The accelerating-voltage power supply 44 applies a negative voltage both to the cathode 40 and the grid 41.

The anode-voltage power supply 45 applies a positive voltage to the anode 42.

Since the electron gun 31 of the three-dimensional AM apparatus 2 has the same configuration as that of the electron gun 11 of the electron microscope 1 shown in FIG. 4, detailed description of configuration examples of the electron gun 31 and electron beam column of the three-dimensional AM apparatus 2 will be omitted.

However, the three-dimensional AM apparatus 2 according to the first embodiment is not provided with the ion reflector 205 and the reflector power supply 206 shown in FIG. 2. Even with such a configuration, the collision of positive ions with the cathode 40 (i.e., ion bombardment) can be prevented by configuring the electron gun 31 in a similar way to that of the electron gun 11 of the electron microscope 1 shown in FIG. 4.

Next, a hardware configuration example of a computer that can operate as the controller 10 or controller 30 will be described below.

Figure 6:
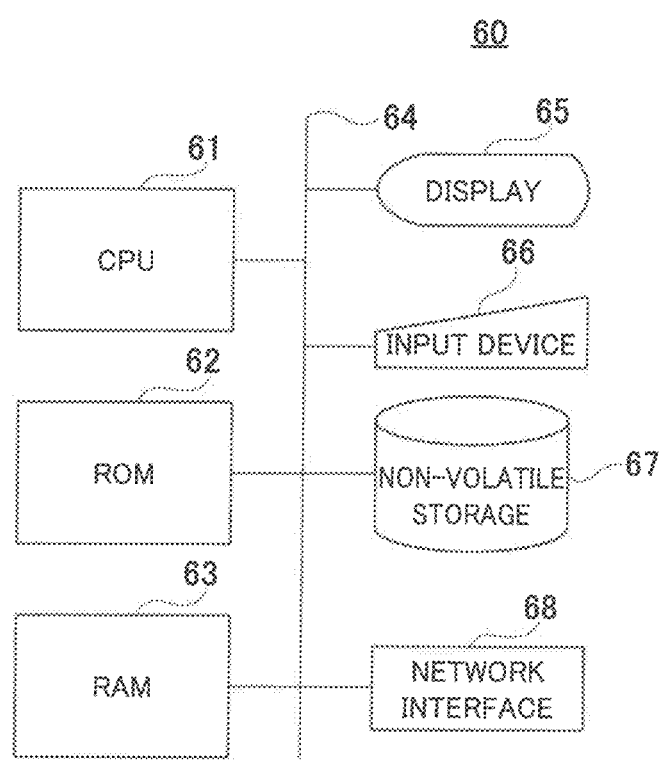
FIG. 6 is a block diagram showing a hardware configuration example of a computer according to the first embodiment of the present invention.

FIG. 6 is a block diagram showing a hardware configuration example of a computer 60.

The computer 60 includes a CPU (Central Processing Unit) 61, a ROM (Read Only Memory) 62, a RAM (Random Access Memory) 63 and a bus 64, wherein the CPU 61, the ROM 62 and the RAM 63 are respectively connected to the bus 64. The computer 60 further includes a display 65, an input device 66, a non-volatile storage 67 and a network interface 68.

The CPU 61 reads the program code of the software that realizes each function according to the present embodiment from the ROM 62, loads the read program code into the RAM 63, and executes the loaded program code. Variables and parameters generated during the arithmetic processing of the CPU 61 are temporarily written in the RAM 63, and these variables and parameters are appropriately read by the CPU 61. However, an MPU (Micro Processing Unit) may be used instead of the CPU 61. The CPU 61 controls the operation of the power supplies 23 to 25 shown in FIG. 3 or the power supplies 43 to 45 shown in FIG. 5 to obtain a desired electron beam B.

The display 65 is, for example, a liquid crystal display monitor, and is adapted to display the result of processing performed by the computer 60 to the user. For example, the display 65 provided in the electron microscope 1 displays the measurement result and image of the specimen; while the display 65 provided in the three-dimensional AM apparatus 2 displays the shaping result of each laminated and shaped layer. A keyboard, a mouse and the like, for example, are used as the input device 66, and the user can perform predetermined operation inputs and instructions from the input device 66.

A HDD (Hard Disk Drive), a SSD (Solid State Drive), a flexible disk, an optical disk, a magneto-optical disk, a CD-ROM, a CD-R, a magnetic tape, a non-volatile memory or the like, for example, may be used as the non-volatile storage 67. In addition to an OS (Operating System) and various parameters, a program for making the computer 60 to function is recorded in this non-volatile storage 67. The ROM 62 and the non-volatile storage 67 permanently record programs, data, and the like necessary for the CPU 61 to operate; the ROM 62 and the non-volatile storage 67 are used as an example of a computer-readable non-transient recording medium having programs to be executed by the computer 60 stored therein.

A NIC (Network Interface Card) or the like, for example, is used as the network interface 68. It is possible to send and receive various data between the electron microscope 1 and a PC or between the three-dimensional AM apparatus 2 and a PC via a LAN (Local Area Network) cable, a dedicated line or the like connected to a terminal of the NIC.

Since the controller 10 provided in the electron gun 11 according to the aforesaid first embodiment controls the anode-voltage power supply 25 to apply a positive voltage to the anode 22, the anode 22 takes in the secondary electrons. Further, the anode 22 functions like a conventional ion reflector because it repels, by its anode potential, the positive ions generated by ionizing the residual gas below the anode 22, so that the positive ions are not directed to the cathode 20. Further, since the anode 22 is formed of titanium (Ti) that suppresses the generation of the secondary electrons, the anode 22 can suppress the generation of the secondary electrons that promote ionization between the cathode 20 and the anode 22, so that the damage to the cathode 20 caused by ion bombardment can be reduced.

Since the controller 30 provided in the electron gun 31 according to the first embodiment controls the anode-voltage power supply 45 to apply a positive voltage to the anode 42, the anode 42 takes in the secondary electrons. Further, the anode 42 functions like a conventional ion reflector because it repels, by its anode potential, the positive ions generated by ionizing the residual gas below the anode 42, so that the positive ions are not directed to the cathode 40. Further, since the anode 42 is formed of titanium (Ti) that suppresses the generation of the secondary electrons, the anode 42 can suppress the generation of the secondary electrons that promote ionization between the cathode 40 and the anode 42, so that the damage to the cathode 40 caused by ion bombardment can be reduced.

As described above, in the electron guns 11, 31, since it is not necessary to provide an ion reflector, the configuration of the apparatuses can be simplified.

In addition to titanium, the anode 22 or 42 may also be formed of one element selected from a group belonging to groups 3 to 6 and periods 4 to 5 in the periodic table of elements (but excluding scandium). For example, any element of vanadium (V), chromium (Cr), yttrium (Y), zirconium (Zr), niobium (Nb) or molybdenum (Mo) can be used as the material for forming the anode 22 or 42.

Second Embodiment

Next, configuration examples and operation examples of an electron gun according to a second embodiment of the present invention will be described below with reference to FIGS. 7-10. In the electron gun according to the second embodiment, it is possible to control the spread of an electron beam B by detecting the anode current.

<Explanation of Spread of Electron Beam>

First, the spread of the electron beam B that changes depending on the cathode temperature will be described below. In the below description, the spread of the electron beam B, and a method of suppressing the spread of the electron beam B will be described with reference to FIGS. 7 to 10, wherein an electron gun 11A of an electron microscope 1 according to the second embodiment is shown in an enlarged manner.

Figure 7:
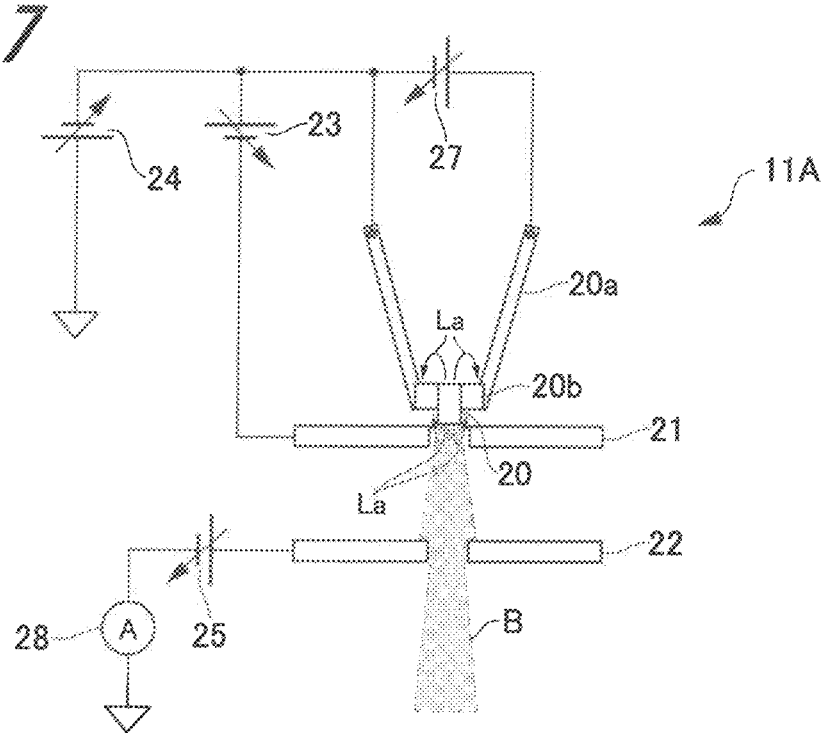
FIG. 7 is a view showing an example of an electron beam emitted from the cathode when the cathode temperature of the electron gun according to a second embodiment of the present invention is low.

FIG. 7 is a view showing an example of an electron beam emitted from the cathode 20 when the cathode temperature of the electron gun 11 is low.

Figure 8:
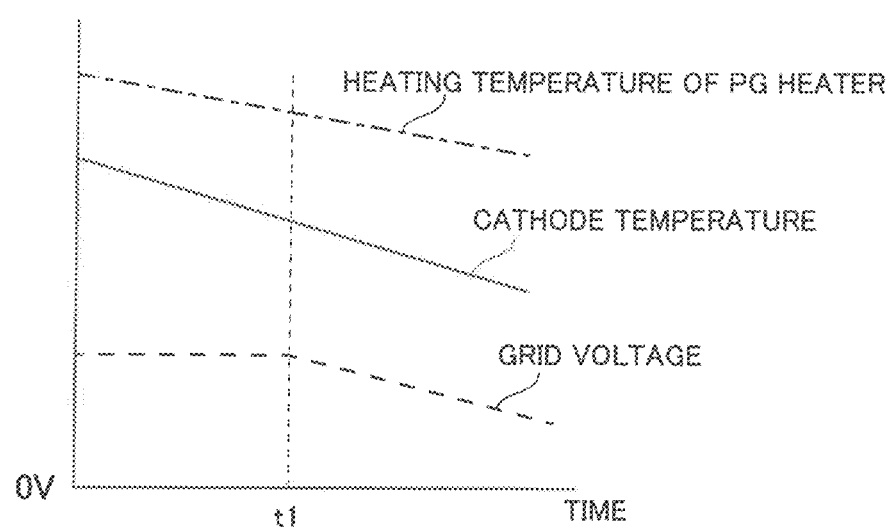
FIG. 8 is a graph showing an example of control parameters of the electron gun according to the second embodiment when the electron gun is controlled when the cathode temperature of the electron gun is low.

FIG. 8 is a graph showing an example of control parameters of the electron gun 11A when the electron gun 11A is controlled when the cathode temperature of the electron gun 11A is low.

As shown in FIG. 7, the PG heater 20b is energized with a cathode 20 surrounded thereby, so that the cathode 20 is heated by the PG heater 20b. As this time, when a part of the lanthanum hexaboride (mainly lanthanum (La)) evaporated from the cathode is deposited on the surface of the PG heater 20b, the resistance of the PG heater 20b will decrease. Therefore, if the heating current supplied to the PG heater 20b does not change, the heating temperature of the PG heater 20b will drop, so that the cathode temperature will also drop.

As shown in FIG. 8, when the cathode temperature of the cathode 20 drops, the number of the thermions emitted from the cathode 20 will decrease, so that the beam current of the electron beam B will decrease. In order to obtain the same level of beam current as it was before the cathode temperature drops, the controller 10 controls to lower the grid voltage of the grid at time t1. At this time, the thermion emission region expands, and the amount of thermions emitted from the cathode 20 also increases.

However, when the grid voltage drops, the electron beam B emitted from the cathode 20 is likely to spread as shown in FIG. 7, so that the amount of the electron beam B that hits the anode increases. Consequently, the angular current density as an electron source is reduced, and the brightness of the electron source is reduced, so that the specimen cannot be observed with appropriate amount of electrons (resolution degradation).

Therefore, in the electron gun 11A according to the present embodiment, an anode-current detector 28 adapted to detect the anode current flowing from the electron beam B into the anode 22 is newly provided. If the anode current detected by the anode-current detector 28 exceeds a preset current threshold, the controller 10 will control to increase the cathode heating current supplied from the cathode heating power supply 27 to the cathode 20 so that the anode current returns to its original value. At this time, the controller 10 controls to increase the cathode heating current according to the increment per unit time of the detected anode current.

In the case of a three-dimensional AM apparatus (a 3D printer), as a relationship between the actual anode current and the filament (i.e., the cathode heating current), it is assumed that, for example, the anode current detected in a normal state is about 20 uA, and the cathode heating current in an initial state is 1100 mA. However, if the electron gun 11A is used for a long time, La will be deposited on the PG heater 20b, so that the resistance of the PG heater 20b will become small. At this time, although the cathode temperature drops, in order to maintain the same beam current, the controller 10 brings the grid voltage closer to the cathode voltage to bring the potential difference between the grid voltage and the cathode voltage closer to 0V.

<Method of Adjusting the Anode Current>

Figure 9:
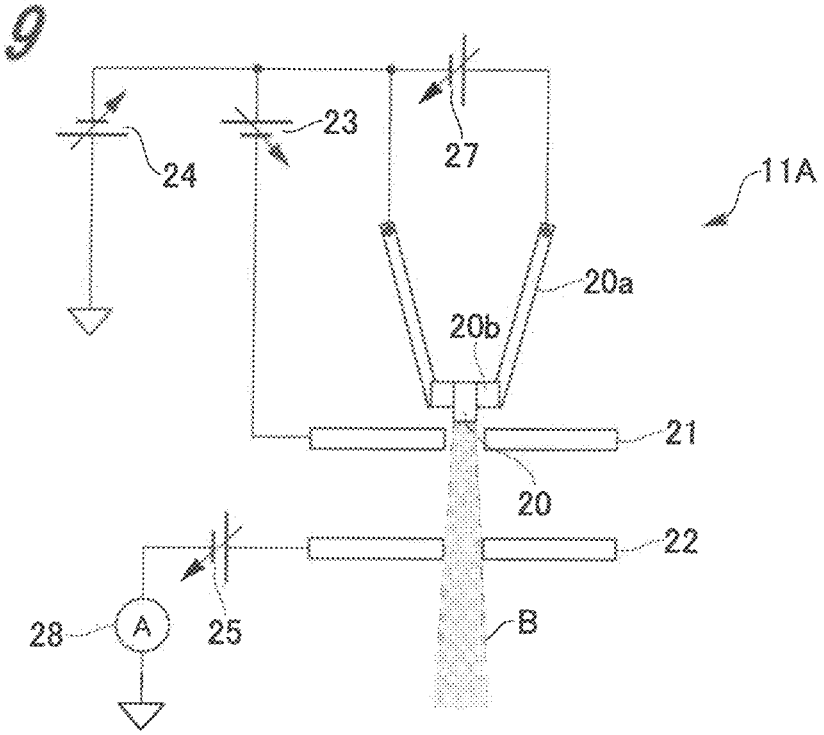
FIG. 9 is a view showing an example of the electron beam emitted from the cathode when the cathode temperature of the electron gun according to the second embodiment of the present invention returns to the original temperature.

FIG. 9 is a view showing an example of an electron beam emitted from the cathode 20 when the cathode temperature of the electron gun 11A returns to the original temperature.

Figure 10:
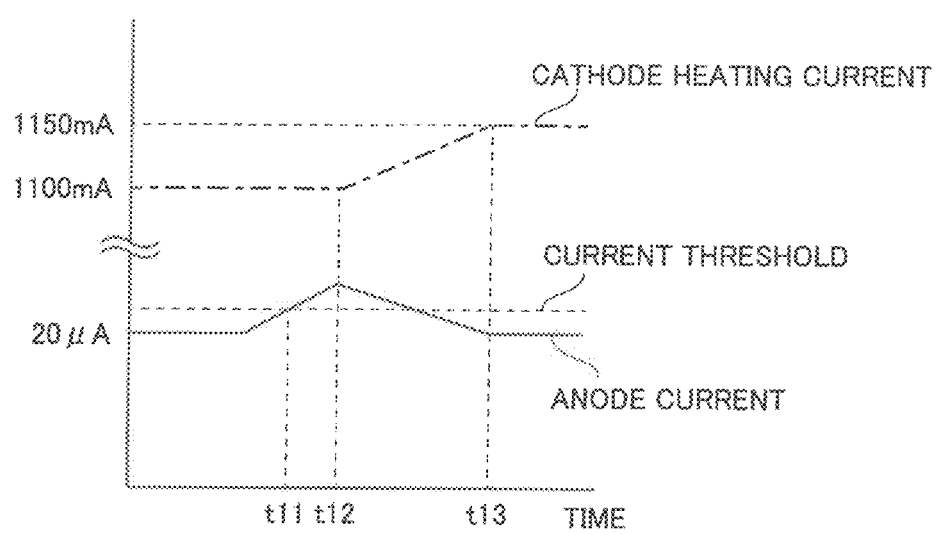
FIG. 10 is a graph showing an example of control parameters of the electron gun according to the second embodiment of the present invention when the electron gun is controlled to return the cathode temperature of the electron gun to its original temperature.

FIG. 10 is a graph showing an example of control parameters of the electron gun 11A when the electron gun 11A is controlled to return the cathode temperature of the electron gun 11A to its original temperature. A controller 10, which is adapted to control the operation of the electron gun 11A, performs a current adjusting method to adjust the anode current of the electron gun 11A following the steps shown in FIG. 10.

First, the controller 10 applies an anode voltage having a positive potential from an anode-voltage power supply 25 to the anode 22. Then, as shown in FIGS. 7 and 8, when the amount of the spread electron beam B hitting the anode 22 increases as the controller 10 lowers the grid voltage, the anode-current detector 28 detects that the anode current flowing through the anode 22 has increased. At this time, the value of the anode current is about one order of magnitude larger than the value of the anode current before the electron beam B hits the anode 22. Therefore, as shown in FIG. 10, at time t11, the anode-current detector 28 detects that the anode current has increased above the current threshold.

Further, at time t12, the controller 10 starts control to lower the anode current so that the anode current returns to its original value at the normal time (which is lower than the current threshold). At this time, the controller 10 controls the cathode heating power supply 27 to increase the cathode heating current of the cathode 20 to heat the cathode 20, while controlling the grid-voltage power supply 23 to raise the grid voltage. By performing such control, in the electron gun 11A shown in FIG. 9, since the potential of the grid 21 increases to the negative side while maintaining the amount of thermions emitted from the cathode 20, the electron beam B is narrowed down, so that the electron gun 11A returns to a normal state where the electron beam B does not hit the anode 22. For example, the controller 10 can reduce the anode current to about 20 uA again by increasing the cathode heating current from 1100 mA to 1150 mA. After the electron beam B returns to the normal state at time t13, the controller 10 continues the process of supplying the increased cathode heating current, as a specified value, to the cathode 20.

The controller 10 provided in the electron gun 11A according to the aforesaid second embodiment evaluates whether the cathode temperature is appropriate based on the detection result of the anode current. Further, the controller 10 can control the cathode 20 to the optimum temperature by increasing the cathode heating current for heating the cathode 20 and the grid voltage so that the anode current returns to the normal value.

Incidentally, the same control as that performed by the electron gun 11A according to the second embodiment may also be performed by the electron gun 31 provided in the three-dimensional AM apparatus 2 shown in FIG. 5. In such case, in the electron gun 31, the anode 42 is provided with an anode-current detector capable of detecting the anode current, and the controller 30 controls the cathode heating current and the grid voltage based on the anode current detected by the anode-current detector.

Third Embodiment

In the electron gun 11A according to the second embodiment described above, the anode-voltage power supply 25 applies an anode voltage having a positive potential to the anode 22. However, the present invention also includes an embodiment in which the electron gun 11A does not have the anode-voltage power supply 25. Here, a configuration example of an electron gun 11B according to a third embodiment will be described below with reference to FIG. 11.

Figure 11:
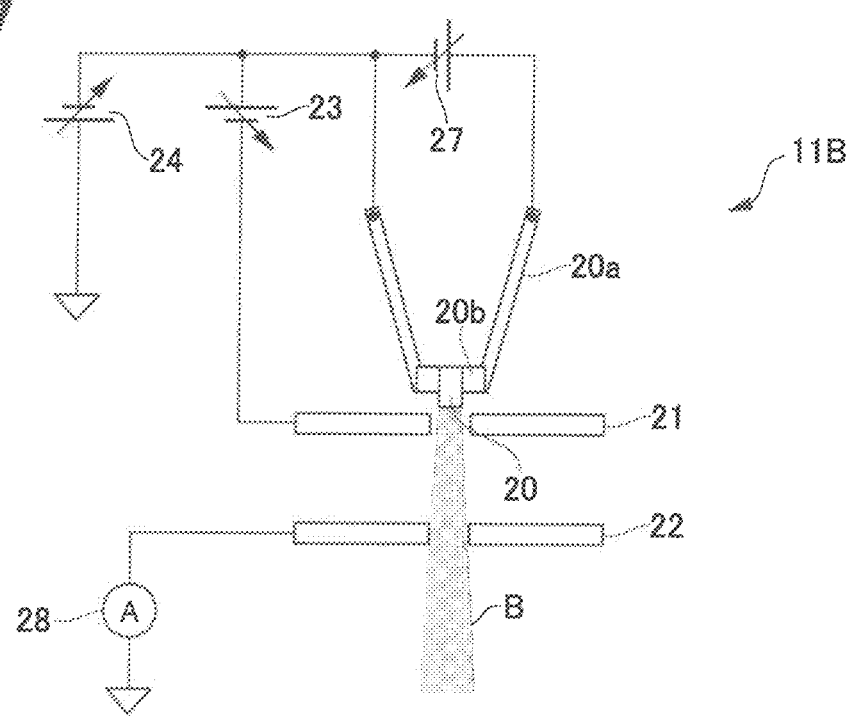
FIG. 11 is an enlarged view of an electron gun according to a third embodiment of the present invention.

FIG. 11 is an enlarged view of an electron gun 11B according to the third embodiment.

In the electron gun 11B, an anode-current detector 28 is connected to an anode 22. The potential of the anode 22 is the ground potential. Even with the electron gun 11B having such a configuration, when the electron beam B spreads so as to hit the anode 22, the anode-current detector 28 detects the increase of the anode current. Further, the controller 10, which is adapted to control the operation of the electron gun 11B, executes a current adjusting method to adjust the anode current of the electron gun 11B following the steps shown in FIG. 10.

For example, the controller 10 controls to increase the cathode heating current and the grid voltage according to the increment per unit time of the anode current detected by the anode-current detector 28. In this way, in order to cause the anode current to return to its original value at normal time, the controller 10 can increase the cathode heating current for heating the cathode 20, so that the cathode 20 is controlled to the optimum temperature.

Incidentally, the same control as that performed by the electron gun 11B according to the third embodiment may also be performed by the electron gun 31 provided in the three-dimensional AM apparatus 2 shown in FIG. 5.

Fourth Embodiment

<In the Case of a Field-Emission Electron Gun>

Next, an example in which the electron gun according to the present invention is applied to a field-emission scanning electron microscope (FE-SEM) will be described below with reference to FIGS. 12 and 13.

FIGS. 12 and 13 are each an enlarged view showing a field-emission electron gun according to the fourth embodiment. FIG. 12 shows an example of an electron beam emitted from the tip of an emitter 72 when an extracting voltage applied from an extracting-voltage power supply 75 to an extracting electrode 74 of the field-emission electron gun 11C is low. FIG. 13 shows an example of an electron beam emitted from the tip of an emitter when the extracting voltage applied to the extracting electrode 74 of the field-emission electron gun 11C is appropriate.

In addition to an anode 22, an accelerating-voltage power supply 24, an anode-voltage power supply 25 and an anode-current detector 28, which are also included in the electron gun 11A (see FIG. 7) according to the second embodiment described above, the field-emission electron gun 11C further includes a heating arm electrode 71, the emitter 72, a flushing heating power supply 73, the extracting electrode 74, and the extracting-voltage power supply 75. The operations of the accelerating-voltage power supply 24, the anode-voltage power supply 25, the anode-current detector 28, the flushing heating power supply 73 and the extracting-voltage power supply 75 are controlled by a controller 70.

The emitter 72 is a component obtained by sharpening a single crystal wire of tungsten or the like by a method of electrolytic polishing or the like. The extracting electrode 74 is arranged to face the emitter 72. The extracting electrode 74 has a first aperture formed therein along a central axis of the tip of the emitter 72, and has an extracting voltage having a potential higher than that of the emitter 72 applied thereto. The extracting electrode 74 extracts electrons from the emitter 72 and passes the extracted electrons through the first aperture by the extracting voltage applied thereto. Further, the anode 22 has a second aperture formed therein along the central axis of the tip of the emitter 72. The anode voltage applied to the anode 22 causes the electrons extracted from the emitter 72 to pass through the second aperture as an electron beam.

A positive voltage (extracting voltage) of several kV is applied to the extracting electrode 74 to extract the electrons from the emitter 72. Further, the anode-voltage power supply 25 applies an anode voltage more positive than the extracting voltage to the anode 22 to accelerate the electrons extracted from the emitter 72. Actually, the anode 22 substantially has a ground potential (here, a positive voltage of about several tens of volts to 1 kV is applied to the anode 22), and the voltage applied to the extracting electrode 74 and the voltage applied to the emitter 72 are both negative voltages.

The flushing heating power supply 73, on which the accelerating voltage is superimposed from the accelerating-voltage power supply 24, is connected to the heating arm electrode 71 formed of a tungsten wire or the like. In the field emission SEM, if electron emission becomes unstable due to the gas and/or the like adsorbed on the tip of the emitter 72, the heating arm electrode 71 will heat the emitter 72 to perform a flushing process on the emitter 72 to thereby clean the tip of the emitter 72.

Here, the flushing process is a step in which the flushing heating power supply 73 energizes the heating arm electrode 71 to heat the heating arm electrode 71 with Joule heat, so that the tip of the emitter 72 is also heated. At this time, the controller 70 applies an anode voltage having a positive potential from the anode-voltage power supply 25 to the anode 22, and causes the flushing heating power supply 73 to energize the heating arm electrode 71 to perform the flushing process. By performing the flushing process, the adsorbed gas is desorbed from the tip of the emitter 72, so that the emitter 72 is cleaned. Incidentally, in the flushing process, since the tip of the emitter 72 is heated, the shape of the tip of the emitter 72 may change at the atomic level depending on the temperature of the flushing process.

Thus, there is a possibility that the SEM image obtained with the emitter 72 before the flushing process may not achieve the same resolution as the SEM image obtained with the emitter after cleaning; one of the reasons of such phenomenon is considered to be the increasing of the aperture angle of the electron emission from the emitter 72 as shown in FIG. 12. In such case, the anode current applied to the anode 22 detected by the anode-current detector 28 increases. Therefore, the controller 70 changes the anode voltage having a positive potential and applied from the anode-voltage power supply 25 to the anode 22 to change the extracting voltage. To be specific, the controller changes, if the detected anode current exceeds a preset current threshold, the extracting voltage so as to return the anode current to its original value.

For example, as shown in FIG. 13, the controller 70 controls to change the extracting voltage applied to the extracting electrode 74 to adjust the anode current to a smaller value. By performing such control, the SEM image obtained with the emitter 72 before the flushing process can achieve the same resolution as the SEM image obtained with the emitter 72 after cleaning. The field-emission electron gun 11C is used as an electron gun provided in the electron microscope 1 and the three-dimensional AM apparatus 2.

It is to be understood that the present invention is not limited to the embodiments described above, and various applications and modifications can be made without departing from the spirit and scope of the present invention.

For example, each of the aforesaid embodiments concretely describes the configurations of the apparatuses in detail for the sake of explaining the present invention in an easy-to-understand manner; however, the configurations described above do not necessarily to be all included. It is possible to replace a part of the configuration of one embodiment described here with the configuration of another embodiment; and further, it is possible to add the configuration of one embodiment to the configuration of another embodiment. It is also possible to add, delete, or replace a part of the configuration of one embodiment with the configuration of another embodiment.

Further, the control lines and information lines indicate those that are considered necessary for explaining the present invention, and the control lines and information lines do not necessarily to be all indicated in the product. It can be considered that almost all configurations are actually interconnected.

What is claimed is:

1. An electron gun comprising:
   a cathode that is heated to emit thermions;
   a cathode heating power supply that supplies a cathode heating current for heating the cathode;
   a grid that has a first aperture formed therein along a central axis of a tip of the cathode and that has a grid voltage applied thereto, the grid voltage having a potential lower than that of the cathode, wherein the grid converges the thermions passing through the first aperture by the grid voltage applied thereto;
   an anode that has a second aperture formed therein along the central axis and that has an anode voltage applied thereto, wherein the anode causes the thermions extracted from the cathode to pass through the second aperture as an electron beam by the anode voltage applied thereto;
   an anode-voltage power supply that applies the anode voltage to the anode;
   a controller that causes the anode voltage having a positive potential to be applied from the anode-voltage power supply to the anode; and
   an anode-current detector that detects an anode current flowing through the anode,
   wherein the controller increases, if the detected anode current exceeds a preset current threshold, the cathode heating current supplied by the cathode heating power supply so as to return the anode current to its original value.

2. The electron gun according claim 1, wherein the controller increases the cathode heating current according to an increment per unit time of the detected anode current.

3. The electron gun according to claim 1, wherein the anode is formed of an element selected from a group belonging to groups 3 to 6 and periods 4 to 5 in the periodic table of elements but excluding scandium.

4. An electron microscope comprising:
   an electron gun according to claim 1;
   a stage having a specimen placed thereon: and
   an electron optical system that scans the specimen placed on the stage with the electron beam.

5. A three-dimensional additive manufacturing apparatus comprising:
   an electron gun according to claim 1;
   a powder bed having a powder specimen spread thereon;
   a powder supply system that supplies the powder specimen to the powder bed; and
   an electron optical system that scans the powder specimen spread on the powder bed with the electron beam.

6. An electron gun comprising:
   a cathode that is heated to emit thermions;
   a cathode heating power supply that supplies a cathode heating current for heating the cathode;
   a grid that has a first aperture formed therein along a central axis of a tip of the cathode and that has a grid voltage applied thereto, the grid voltage having a potential lower than that of the cathode, wherein the grid converges the thermions passing through the first aperture by the grid voltage applied thereto;
   an anode that has a second aperture formed therein along the central axis, wherein the anode causes the thermions extracted from the cathode to pass through the second aperture as an electron beam by a ground potential;
   an anode-current detector that detects an anode current flowing through the anode, and
   a controller that increases, if the detected anode current exceeds a preset current threshold, the cathode heating current supplied from the cathode heating power supply to the cathode so as to return the anode current to its original value.

7. An electron microscope comprising:
   an electron gun according to claim 6;
   a stage having a specimen placed thereon: and
   an electron optical system that scans the specimen placed on the stage with the electron beam.

8. A three-dimensional additive manufacturing apparatus comprising:
   an electron gun according to claim 6;
   a powder bed having a powder specimen spread thereon;
   a powder supply system that supplies the powder specimen to the powder bed; and
   an electron optical system that scans the powder specimen spread on the powder bed with the electron beam.

9. An electron gun comprising:
   an emitter;
   an extracting electrode that has a first aperture formed therein along a central axis of a tip of the emitter and that has an extracting voltage applied thereto, the extracting voltage having a potential higher than that of the emitter, wherein the extracting electrode extracts electrons from the emitter and passes the extracted electrons through the first aperture by the extracting voltage applied thereto;
   an anode that has a second aperture formed therein along the central axis and that has an anode voltage having a positive potential applied thereto, wherein the anode causes the electrons extracted from the emitter to pass through the second aperture as an electron beam by the anode voltage applied thereto;
   an anode-voltage power supply that applies the anode voltage to the anode;
   a controller that changes the anode voltage applied to the anode to change the extracting voltage; and
   an anode-current detector that detects an anode current flowing through the anode, wherein the controller changes, if the detected anode current exceeds a preset current threshold, the extracting voltage so as to return the anode current to its original value.

10. The electron gun according claim 9, further comprising:
a heating electrode that heats the emitter to perform a flushing process on the emitter; and
a heating power supply that energizes the heating electrode to heat the heating electrode,
wherein the controller causes the heating power supply to energize the heating electrode to perform the flushing process.

11. An electron microscope comprising:
an electron gun according to claim 9;
a stage having a specimen placed thereon: and
an electron optical system that scans the specimen placed on the stage with the electron beam.

12. A three-dimensional additive manufacturing apparatus comprising:
an electron gun according to claim 9;
a powder bed having a powder specimen spread thereon;
a powder supply system that supplies the powder specimen to the powder bed; and
an electron optical system that scans the powder specimen spread on the powder bed with the electron beam.

13. A current adjusting method of an electron gun, wherein the electron gun comprises:
a cathode that is heated to emit thermions;
a cathode heating power supply that supplies a cathode heating current for heating the cathode;
a grid that has a first aperture formed therein along a central axis of a tip of the cathode and that has a grid voltage applied thereto, the grid voltage having a potential lower than that of the cathode, wherein the grid converges the thermions passing through the first aperture by the grid voltage applied thereto;
an anode that has a second aperture formed therein along the central axis and that has an anode voltage applied thereto, wherein the anode causes the thermions extracted from the cathode to pass through the second aperture as an electron beam by the anode voltage applied thereto;
an anode-voltage power supply that applies the anode voltage to the anode;
a controller; and
a anode-current detector that detects an anode current flowing through the anode,
the method comprising:
causing, by the controller, the anode voltage having a positive potential to be applied from the anode-voltage power supply to the anode;
causing, by the controller, the anode-current detector to detect the anode current; and
increasing, by the controller, the cathode heating current supplied from the cathode heating power supply to the cathode so as to return the anode current to its original value if the detected anode current exceeds a preset current threshold.

14. A current adjusting method of an electron gun, wherein the electron gun comprises:
a cathode that is heated to emit thermions;
a cathode heating power supply that supplies a cathode heating current for heating the cathode;
a grid that has a first aperture formed therein along a central axis of a tip of the cathode and that has a grid voltage applied thereto, the grid voltage having a potential lower than that of the cathode, wherein the grid converges the thermions passing through the first aperture by the grid voltage applied thereto;
an anode that has a second aperture formed therein along the central axis, wherein the anode causes the thermions extracted from the cathode to pass through the second aperture as an electron beam by a ground potential;
a controller; and
a anode-current detector that detects an anode current flowing through the anode,
the method comprising:
causing, by the controller, the anode-current detector to detect the anode current; and
increasing, by the controller, the cathode heating current supplied from the cathode heating power supply to the cathode so as to return the anode current to its original value if the detected anode current exceeds a preset current threshold.

15. A current adjusting method of an electron gun, wherein the electron gun comprises:
an emitter;
an extracting electrode that has a first aperture formed therein along a central axis of a tip of the emitter and that has an extracting voltage applied thereto, the extracting voltage having a potential higher than that of the emitter, wherein the extracting electrode extracts electrons from the emitter and passes the extracted electrons through the first aperture by the extracting voltage applied thereto;
an anode that has a second aperture formed therein along the central axis and that has an anode voltage applied thereto, wherein the anode causes the electrons extracted from the emitter to pass through the second aperture as an electron beam by the anode voltage applied thereto;
an anode-voltage power supply that applies the anode voltage to the anode;
a heating electrode that heats the emitter to perform a flushing process on the emitter;
a heating power supply that energizes the heating electrode to heat the heating electrode;
a controller; and
an anode-current detector that detects an anode current flowing through the anode,
the method comprising:
causing, by the controller, the anode voltage having a positive potential to be applied from the anode-voltage power supply to the anode;
causing, by the controller, the anode-current detector to detect the anode current; and
changing, by the controller, the extracting voltage so as to return the anode current to its original value if the detected anode current exceeds a preset current threshold.

16. A three-dimensional additive manufacturing apparatus comprising:
an electron gun comprising:
a cathode that is heated to emit thermions;
a cathode heating power supply that supplies a cathode heating current for heating the cathode;
a grid that has a first aperture formed therein along a central axis of a tip of the cathode and that has a grid voltage applied thereto, the grid voltage having a potential lower than that of the cathode, wherein the grid converges the thermions passing through the first aperture by the grid voltage applied thereto;

an anode that has a second aperture formed therein along the central axis and that has an anode voltage applied thereto, wherein the anode causes the thermions extracted from the cathode to pass through the second aperture as an electron beam by the anode voltage applied thereto, and wherein the anode voltage applied to the anode is a positive potential of 60 V to 1 kV;

a gun chamber formed to house the cathode, the grid, and the anode;

an anode-voltage power supply that applies the anode voltage to the anode; and a controller that causes the anode voltage having a positive potential to be applied from the anode-voltage power supply to the anode;

a powder bed having a powder specimen spread thereon;

a powder supply system that supplies the powder specimen to the powder bed;

an electron optical system that scans the powder specimen spread on the powder bed with the electron beam; and a liner tube arranged between the anode and the powder bed and maintained at a ground potential, the liner tube having a first end connected to an opening formed in the gun chamber, and the electron optical system being arranged outside of the liner tube.

* * * * *